(12) United States Patent
Wakaki (10) Patent No.: US 10,873,007 B2
(45) Date of Patent: Dec. 22, 2020

(54) LIGHT-EMITTING DEVICE WITH TRENCH AND THROUGH-HOLE IN A PAIR OF LEADS FOR STRESS REDUCTION

(71) Applicant: NICHIA CORPORATION, Anan (JP)

(72) Inventor: Ryosuke Wakaki, Tokushima (JP)

(73) Assignee: NICHIA CORPORATION, Anan (JP)

( * ) Notice: Subject to any disclaimer, the term of this patent is extended or adjusted under 35 U.S.C. 154(b) by 5 days.

(21) Appl. No.: 16/535,460

(22) Filed: Aug. 8, 2019

(65) Prior Publication Data

US 2020/0052167 A1 Feb. 13, 2020

(30) Foreign Application Priority Data

Aug. 9, 2018 (JP) .................... 2018-150552

(51) Int. Cl.
*H01L 33/48* (2010.01)
*H01L 33/62* (2010.01)
*H01L 33/54* (2010.01)
*H01L 33/00* (2010.01)

(52) U.S. Cl.
CPC ............ *H01L 33/486* (2013.01); *H01L 33/62* (2013.01); *H01L 33/0095* (2013.01); *H01L 33/54* (2013.01)

(58) Field of Classification Search
CPC .............................. H01L 33/486; H01L 33/62
See application file for complete search history.

(56) References Cited

U.S. PATENT DOCUMENTS 10,439,107 B2 * 10/2019 Heikman ............ H01L 33/0095
10,593,847 B2 * 3/2020 Ukawa ..................... H01L 33/62

2013/0062613 A1 3/2013 Takeshita et al.
2014/0197438 A1 7/2014 Oh et al.
2015/0340568 A1 11/2015 Hsieh et al.

FOREIGN PATENT DOCUMENTS

| CN | 105449076 A | 3/2016 |
|---|---|---|
| JP | 2012-515440 A | 7/2012 |
| JP | 2012-209367 A | 10/2012 |
| JP | 2013-62338 A | 4/2013 |
| JP | 2014-135489 A | 7/2014 |
| JP | 2015-222831 A | 12/2015 |
| JP | 2015-226063 A | 12/2015 |
| JP | 2017-41570 A | 2/2017 |
| WO | WO 2010/081403 A1 | 7/2010 |

* cited by examiner

*Primary Examiner* — Andrew Q Tran
(74) *Attorney, Agent, or Firm* — Birch, Stewart, Kolasch & Birch, LLP (57) ABSTRACT

A light-emitting device includes a package and a light-emitting element. The package includes a pair of leads each including a main body portion and an extension portion, a resin portion holding the pair of leads, and a concave portion having a bottom surface where an upper surface of each of the pair of leads is exposed. The extension portion extends from an outer edge of the main body portion to an outer surface of the package. The light-emitting element is mounted at the bottom surface of the concave portion. The main body portion has a trench and a through-hole in a portion of the main body portion buried in a sidewall of the concave portion. The through-hole is continuous with the trench. When viewed in top-view, the through-hole is provided inward of the outer edge of the main body portion at a vicinity of the extension portion.

6 Claims, 9 Drawing Sheets

LIGHT-EMITTING DEVICE WITH TRENCH AND THROUGH-HOLE IN A PAIR OF LEADS FOR STRESS REDUCTION

CROSS-REFERENCE TO RELATED APPLICATION

This application is based upon and claims priority to Japanese Patent Application No. 2018-150552, filed on Aug. 9, 2018, the entire contents of which are incorporated herein by reference.

FIELD

This invention described herein relates to a light-emitting device.

BACKGROUND

A method for manufacturing a light-emitting device that obtains multiple light-emitting devices is known. In the method, a resin-molded leadframe including a resin molded body and a leadframe formed as one body is prepared, and the resin molded body and portions (link portions) that link lead portions to each other are cut together.

SUMMARY

According to an embodiment of the invention, a light-emitting device includes a package and a light-emitting element. The package includes a pair of leads each including a main body portion and an extension portion, a resin portion holding the pair of leads, and a concave portion having a bottom surface where an upper surface of each of the pair of leads is exposed. The extension portion extends from an outer edge of the main body portion to an outer surface of the package; and the light-emitting element is mounted at the bottom surface of the concave portion. The main body portion has a trench and a through-hole in a portion of the main body portion buried in a sidewall of the concave portion; and the through-hole is, continuous with the trench. When viewed in top-view, the through-hole is provided inward of the outer edge of the main body portion at a vicinity of the extension portion.

DETAILED DESCRIPTION

Embodiments will now be described with reference to the drawings. The same components in the drawings are marked with the same reference numerals.

Figure 1:
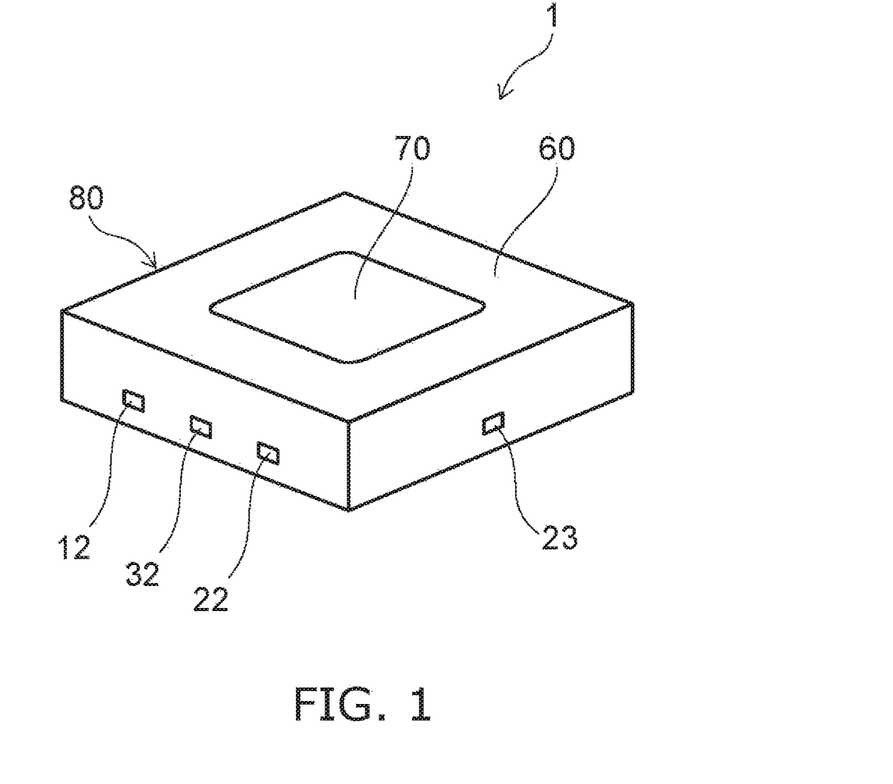
FIG. 1 is an isometric drawing of a light-emitting device of an embodiment of the invention.

FIG. 1 is an isometric drawing of a light-emitting device 1 of the embodiment of the invention.

Figure 2:
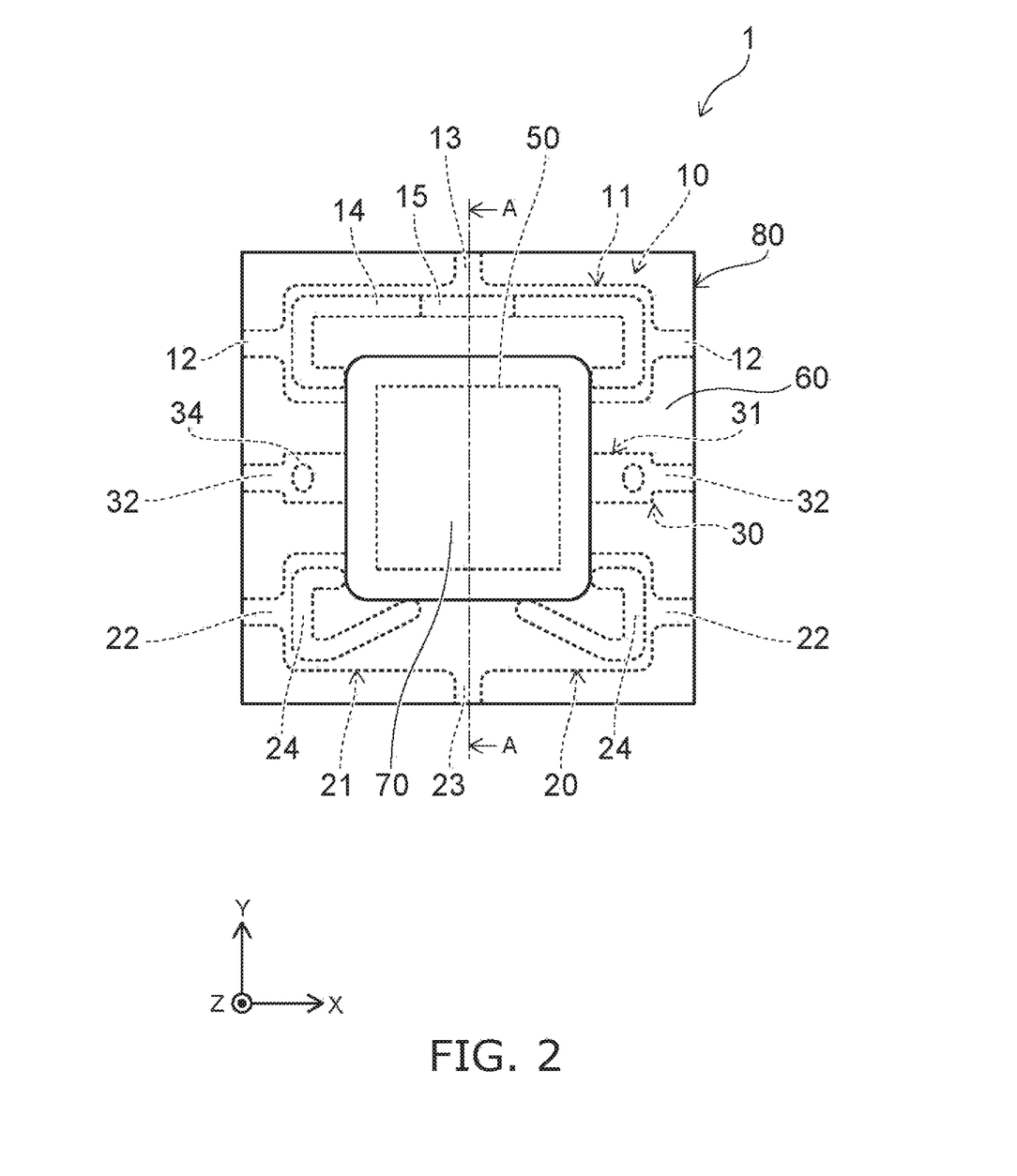
FIG. 2 is a top view of the light-emitting device of the embodiment of the invention.

FIG. 2 is a top view of the light-emitting device 1. Components (a light-emitting element 50 and first to third leads 10, 20, and 30) that are hidden in FIG. 2 are illustrated by broken lines.

Figure 3:
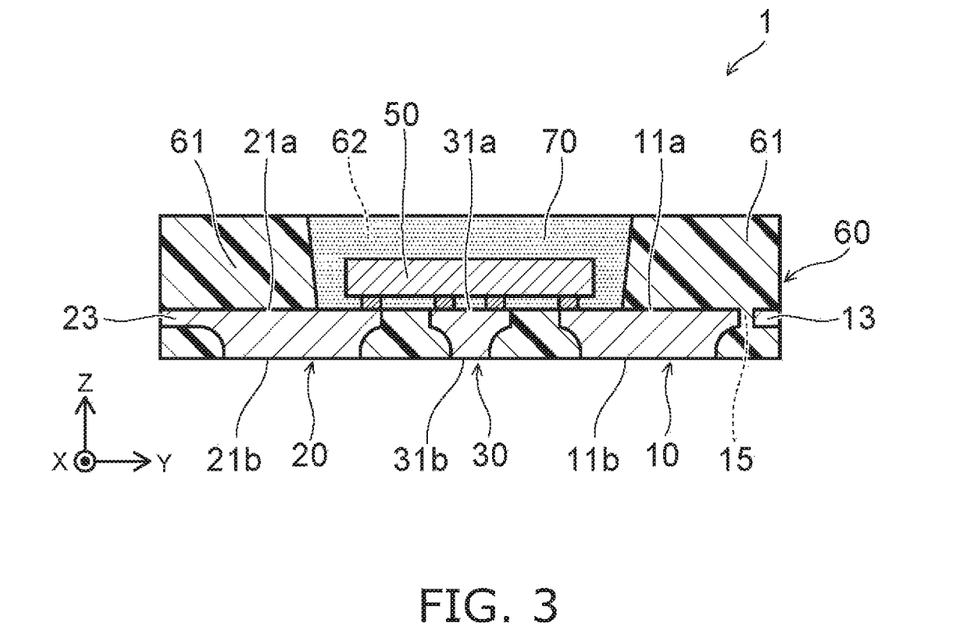
FIG. 3 is an A-A cross-sectional view of FIG. 2.

FIG. 3 is an A-A cross-sectional view of FIG. 2.

The light-emitting device 1 includes a package 80 and the light-emitting element 50.

Figure 4:
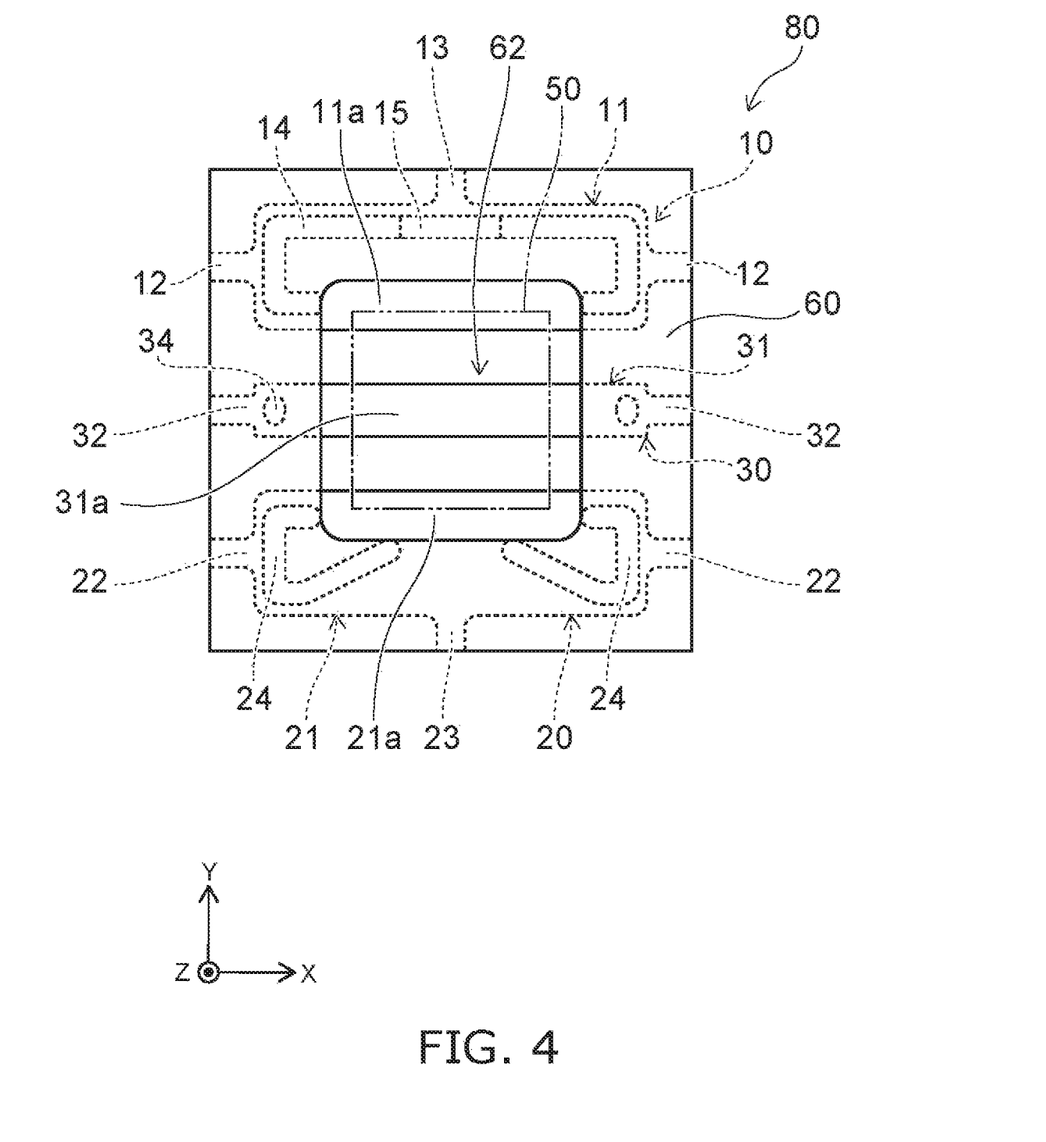
FIG. 4 is a top view of a package of the light-emitting device of the embodiment of the invention.

FIG. 4 is a top view of the package 80 before disposing the light-emitting element 50. In FIG. 4, the arrangement position of the light-emitting element 50 is illustrated virtually by a double dot-dash line.

The package 80 includes at least a pair of leads (the first lead 10 and the second lead 20) and a resin portion 60. In the embodiment, the package 80 further includes the third lead 30.

The resin portion 60 holds the first lead 10, the second lead 20, and the third lead 30. As shown in FIG. 3, a portion of the resin portion 60 is provided between the first lead 10 and the third lead 30 and between the second lead 20 and the third lead 30.

The package 80 includes a concave portion 62. A portion of an upper surface 11a of the first lead 10, a portion of an upper surface 21a of the second lead 20, and a portion of an upper surface 31a of the third lead 30 are exposed at the bottom surface of the concave portion 62.

The light-emitting element 50 is mounted at the bottom surface of the concave portion 62. The light-emitting element 50 is, for example, an LED (Light Emitting Diode) or a LD (Laser Diode). A transparent resin portion 70 is provided to cover the light-emitting element 50 inside the concave portion 62.

The transparent resin portion 70 is, for example, a fluorescer layer including fluorescer particles. The transparent resin portion 70 may further include a scattering member.

The first lead 10 includes a main body portion 11 and an extension portion 13. The package 80 shown in FIG. 2 further includes two extension portions 12. As shown in FIG. 1 and FIG. 2, the extension portions 12 and 13 extend from the outer edge of the main body portion 11 to the outer surface of the package 80.

In FIG. 2, the extension portion 13 extends in the reverse direction of the direction toward the third lead 30 along a Y-axis direction. The two extension portions 12 extend in mutually-reverse directions along an X-axis direction.

The main body portion 11 has the upper surface 11a, and a lower surface 11b provided on the side opposite to the upper surface 11a. As shown in FIGS. 3 and 4, the upper surface 11a includes a portion buried in a sidewall 61 (formed of the resin portion 60) forming the concave portion 62. A trench 14 and a through-hole 15 are positioned in the portion of the upper surface 11a of the main body portion 11 buried in the sidewall 61.

The through-hole 15 pierces the main body portion 11 in the thickness direction (a Z-axis direction). The trench 14 is a trench that has a bottom and does not pierce through the main body portion 11. The through-hole 15 is continuous with the trench 14. Thereby, because the resin portion 60 that enters the through-hole 15 and the trench 14 is continuous, the adhesion between the resin portion 60 and the first lead 10 at the through-hole 15 vicinity can be improved. As shown in FIG. 3, a portion of the resin portion 60 is inside the through-hole 15.

Figure 5:
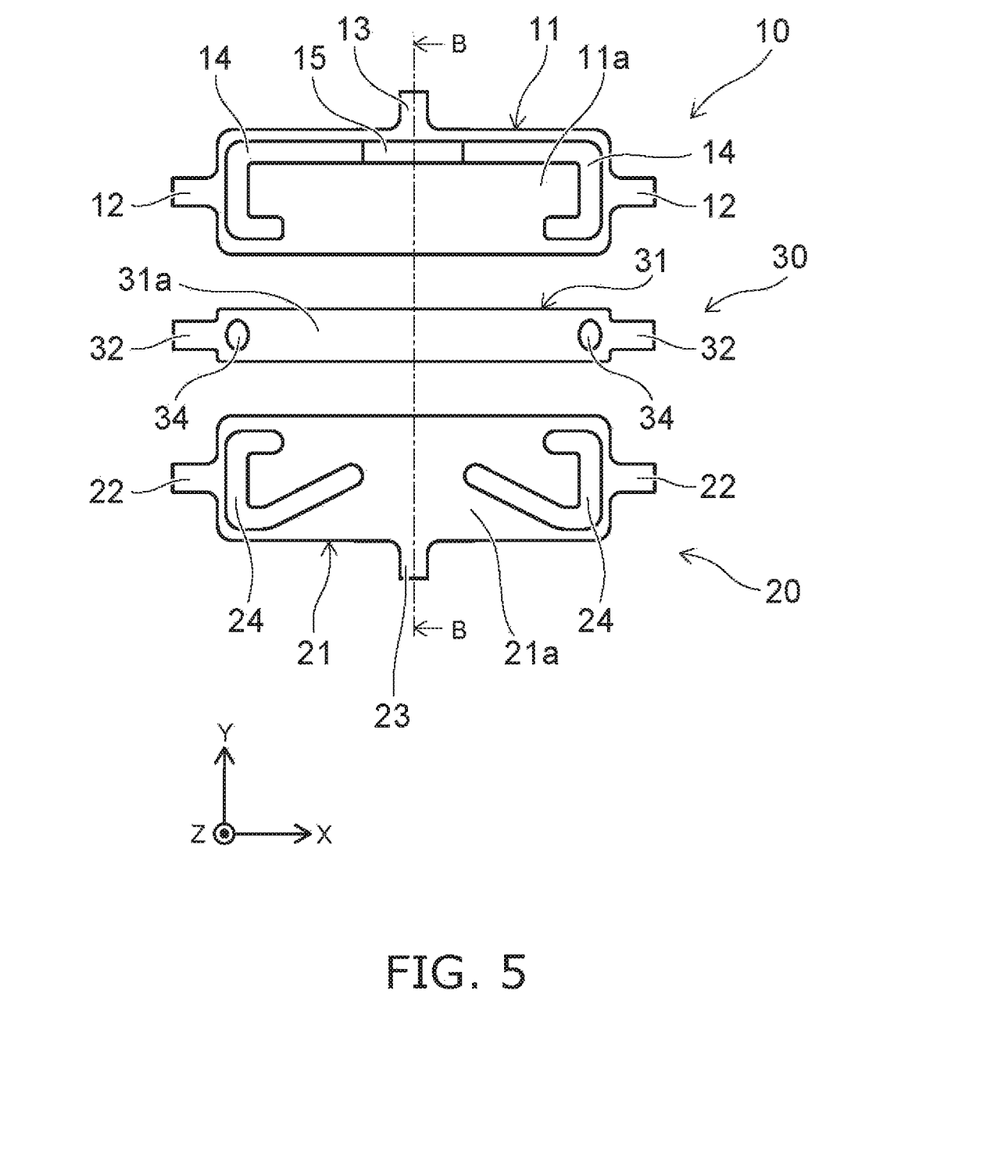
FIG. 5 is a top view of a lead of the light-emitting device of the embodiment of the invention.

FIG. 5 is a top view of the first lead 10, the second lead 20, and the third lead 30.

Figure 6:
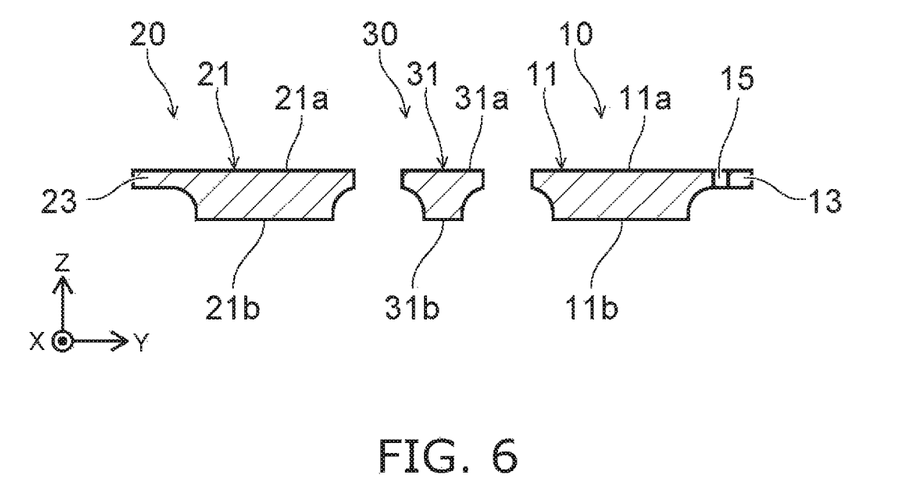
FIG. 6 is a B-B cross-sectional view of FIG. 5.

FIG. 6 is a B-B cross-sectional view of FIG. 5.

Figure 7:
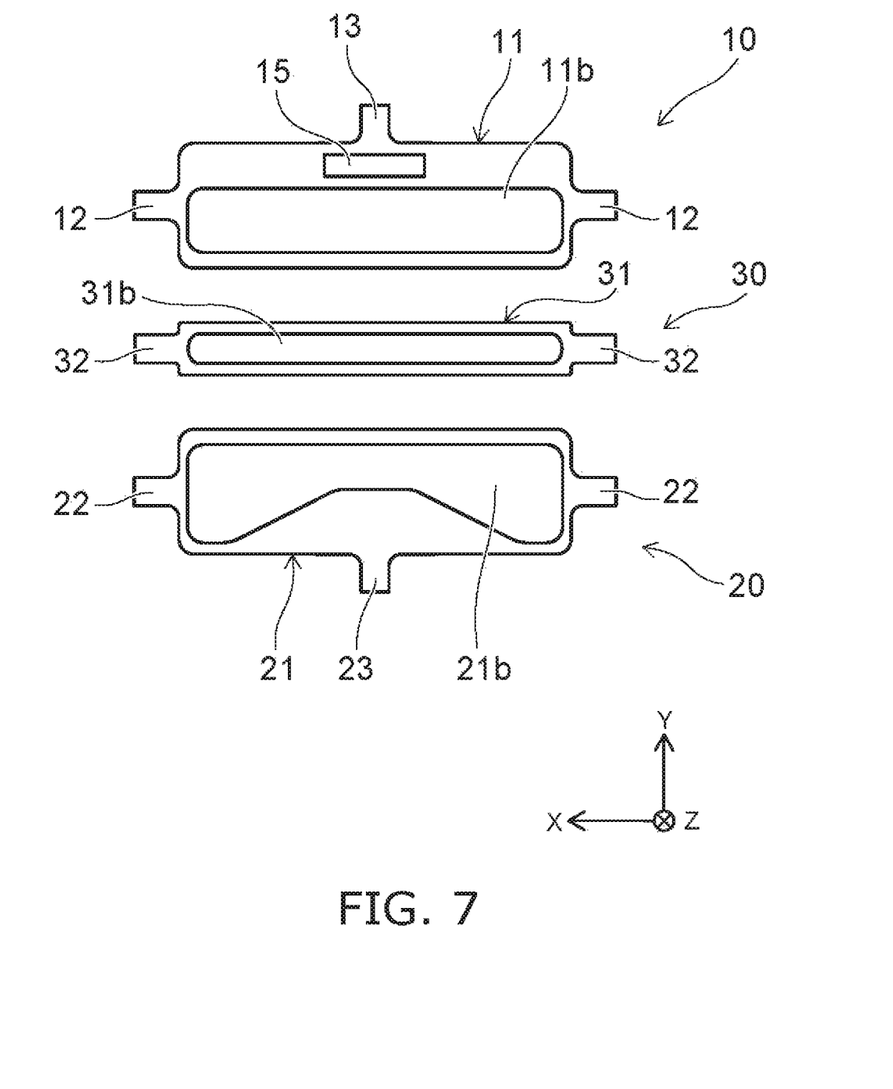
FIG. 7 is a bottom view of the lead of the light-emitting device of the embodiment of the invention.

FIG. 7 is a bottom view of the first lead 10, the second lead 20, and the third lead 30.

In FIG. 5, the first lead 10 and the third lead 30 are separated from each other in the Y-axis direction; and the third lead 30 and the second lead 20 are separated from each other in the Y-axis direction. The third lead 30 is positioned between the first lead 10 and the second lead 20.

The first lead 10, the second lead 20, and the third lead 30 are a metal material. For example, the first lead 10, the second lead 20, and the third lead 30 are a member in which silver plating of a copper material is performed.

When the first lead 10 is viewed in top-view as shown in FIG. 5, the through-hole 15 is provided at the vicinity of the extension portion 13 and inward of the outer edge of the main body portion 11. Also, as shown in FIG. 2, the through-hole 15 is at a position more proximal to the extension portion 13 than is the light-emitting element 50.

When viewed in top-view in FIG. 2, the through-hole 15 has a configuration extending along the outer surface of the package 80. When viewed in top-view, the through-hole 15 has a configuration extending along a direction crossing a straight line connecting the extension portion 13 and the light-emitting element 50. When viewed in top-view, it is favorable for the length of the through-hole 15 in the direction along the outer surface to be longer than the length of the extension portion 13 in the direction along the outer surface. In the case where stress is applied in the direction along the outer surface of the package 80, such a through-hole 15 can reduce the stress over a long distance. For example, stress is applied in the direction along the outer surface of the package 80 in the case where a collective substrate including multiple packages 80 is prepared and the outer surface of the package 80 is formed by cutting the collective substrate using a dicing blade, etc. In such a case, the stress due to the cutting can be reduced effectively by the package 80 having the through-hole 15 extending along the outer surface. The through-hole 15 may not have a configuration extending along the outer surface of the package 80. Although the width of the through-hole 15 and the width of the trench 14 are the same in the direction of the straight line connecting the extension portion 13 and the light-emitting element 50 in FIG. 2, the width of the through-hole 15 and the width of the trench 14 may be different.

It is favorable for the through-hole 15 to be positioned on the shortest path from the extension portion 13 to the concave portion 62 when viewed in top-view. It is more favorable for the length of the through-hole 15 in the direction along the outer surface of the package 80 to be greater than the width of the path recited above. Thereby, in the case where components such as sulfur or the like in ambient air enters from the extension portion 13, the path for the components such as sulfur or the like to reach the concave portion 62 can be lengthened. As a result, the degradation of the leads positioned at the bottom surface of the concave portion 62 due to the components such as sulfur or the like can be suppressed.

As shown in FIG. 3, the lower surface 11b of the main body portion 11 of the first lead 10 is exposed at the resin portion 60. A lower surface 21b of the second lead 20 and a lower surface 31b of the third lead 30 similarly are exposed at the resin portion 60. As shown in FIG. 7, it is favorable for the through-hole 15 in the first lead 10 to be positioned between the lower surface 11b and the extension portion 13 so that the through-hole 15 does not overlap the lower surface 11b which is bonded to a circuit board, etc. Thereby, it is unnecessary to change the configuration of the wiring of the circuit board, etc., because the configuration of the lower surface 11b bonded to the circuit board, etc., does not change.

The second lead 20 and the third lead 30 shown in FIG. 2 have a trench 24 and a trench 34, respectively. The trench 24 is formed in the portion of the upper surface 21a of a main body portion 21 buried in the sidewall 61. The trench 34 is formed in the portion of the upper surface 31a of a main body portion 31 buried in the sidewall 61.

The resin portion 60 may include a thermosetting resin, a thermoplastic resin, etc., as the resin material used as the main material. Specifically, a cured body such as an epoxy resin composition, a silicone resin composition, a modified epoxy resin composition such as a silicone-modified epoxy resin or the like, a modified silicone resin composition such as an epoxy-modified silicone resin or the like, an unsaturated polyester resin, a saturated polyester resin, a polyimide resin composition, a modified polyimide resin composition, etc., or a resin such as polyphthalamide (PPA), a polycarbonate resin, polyphenylene sulfide (PPS), a liquid crystal polymer (LCP), an ABS resin, a phenol resin, an acrylic resin, a PBT resin, etc., can be used. In particular, it is favorable for a thermosetting resin such as an epoxy resin composition or a silicone resin composition that has excellent heat resistance and lightfastness to be used as the resin material of the resin portion 60.

It is favorable for the resin portion 60 to include a light-reflective substance in the resin material used as the main material recited above. As the light-reflective substance, it is favorable to use a member that does not easily absorb the light from the light-emitting element 50 and has a large refractive index difference with respect to the resin material used as the main material. Such a light-reflective substance is, for example, titanium oxide, zinc oxide, silicon oxide, zirconium oxide, aluminum oxide, aluminum nitride, etc.

To improve the contrast of the light-emitting device 1, the resin portion 60 also may include a filler having a low light reflectance for the external light (in many cases, sunlight) of the light-emitting device 1. In such a case, for example, the resin portion 60 may be black or a color that is substantially black. As the filler, carbon such as acetylene black, activated carbon, graphite, or the like, a transition metal oxide such as iron oxide, manganese dioxide, cobalt oxide, molybdenum oxide, or the like, a colored organic pigment, etc., can be utilized according to the purpose.

The leads 10, 20, and 30 are conductive and function as electrodes for supplying power to the light-emitting element 50. As the main material, the leads 10, 20, and 30 may include, for example, copper, aluminum, gold, silver, iron, nickel, or an alloy of these metals, a metal such as phosphor bronze, iron-including copper, etc. The components may be a single layer or may have a stacked structure (e.g., a cladding material). In particular, it is favorable for the main material to include copper which is inexpensive and has good heat dissipation. The leads 10, 20, and 30 may include a silver-including layer at the surface. Also, the leads 10, 20, and 30 may include an intermediate layer between the main material and the silver-including layer. The intermediate layer includes, for example, aluminum, nickel, palladium, rhodium, gold, copper, an alloy of these metals, etc. The silver-including layer or the intermediate layer may be provided on the entire surfaces of the leads 10, 20, and 30 or may be provided partially. For example, the silver-including layer or the intermediate layer that is formed on the upper surface side of the leads 10, 20, and 30 may be set to be thicker than the silver-including layer or the intermediate layer formed on the lower surface side of the leads 10, 20, and 30.

A protective layer of silicon oxide, etc., may be provided on the outermost surface (e.g., the surface of the silver-including layer) of the leads 10, 20, and 30. By providing the protective layer on the front surface of the silver-including layer, for example, the progress of the degradation of the silver-including layer can be obstructed effectively by the protective layer in the case where sulfur or the like enters the concave portion 62. The film formation method of the protective layer may be, for example, a vacuum process such as sputtering, etc.; and any other known method may be used.

It is sufficient for the package 80 to include at least the first lead 10 and the second lead 20. The third lead 30 may function as an electrode or may function as a heat-dissipating member.

The light-emitting element 50 may include a light-emitting diode element, etc. For example, it is favorable for the light-emitting element 50 to be a nitride semiconductor ($In_xAl_yGa_{1-x-y}N$ in which $0 \leq x$, $0 \leq y$, and $x+y \leq 1$) that can emit light in the visible region. It is sufficient for the light-emitting device 1 to include at least one light-emitting element 50; and the number of the light-emitting elements 50 is modifiable according to the purpose and/or the application.

In the case where the light-emitting device 1 includes multiple light-emitting elements, the multiple light-emitting elements may include, for example, multiple light-emitting elements emitting blue light, three light-emitting elements respectively emitting blue light, green light, and red light, or a combination of a light-emitting element emitting blue light and a light-emitting element emitting green light. In the case where the light-emitting device 1 is used as a light source of a liquid crystal display device, etc., it is favorable to use a light-emitting element emitting blue light or a combination of a light-emitting element emitting blue light and a light-emitting element emitting green light as the light-emitting element. It is favorable for the light-emitting element emitting blue light and the light-emitting element emitting the green light each to have a width at half maximum of 40 nm or less, and more favorable to have a width at half maximum of 30 nm or less. Thereby, the blue light and the green light can easily have sharp peaks. As a result, for example, in the case where the light-emitting device 1 is used as a light source of a liquid crystal display device, etc., the liquid crystal display device can have high color reproducibility.

The transparent resin portion 70 can protect the light-emitting element 50, etc., from external forces, dust, moisture, etc. For example, it is favorable for the transparent resin portion 70 to transmit 60% or more of the light emitted from the light-emitting element 50, and more favorable to transmit 90% or more. The resin material of the resin portion 60 may be used as the main material of the transparent resin portion 70. As the resin material used as the main material, a thermosetting resin, a thermoplastic resin, etc., may be used; for example, a silicone resin, an epoxy resin, an acrylic resin, or a resin including one or more of these resins may be used. The transparent resin portion 70 may be formed from a single layer or may include multiple layers. Also, light-scattering particles of titanium oxide, silicon oxide, zirconium oxide, aluminum oxide, etc., may be dispersed in the transparent resin portion 70.

The transparent resin portion 70 may include one or multiple types of fluorescers converting the wavelength of the light from the light-emitting element 50. It is sufficient for the fluorescer to be excited by the light of the light-emitting element 50; and the fluorescer may be, for example, a fluorescer of $(Ca, Sr, Ba)_5(PO_4)_3(Cl, Br):Eu$, $(Sr, Ca, Ba)_4Al_{14}O_{25}:Eu$, $(Ca, Sr, Ba)_8MgS_{14}O_{16}(F, Cl, Br)_2:Eu$, $(Y, Lu, Gd)_3(Al, Ga)_5O_{12}:Ce$, $(Sr, Ca)AlSiN_3:Eu$, $3.5MgO \cdot 0.5MgF_2 \cdot GeO_2:Mn$, $(x-s)MgO \cdot (s/2)Sc_2O_3 \cdot yMgF_2 \cdot uCaF_2 \cdot (1-t)GeO_2 \cdot (t/2)M^t_2O_3:zMn$, $Ca_3Sc_2Si_3O_{12}:Ce$, $CaSc_2O_4:Ce$, $(La, Y)_3Si_6N_{11}:Ce$, $(Ca, Sr, Ba)_3Si_6O_9N_4:Eu$, $(Ca, Sr, Ba)_3Si_6O_{12}N_2:Eu$, $(Ba, Sr, Ca)Si_2O_2N_2:Eu$, $(Ca, Sr, Ba)_2Si_5N_8:Eu$, $(Ca, Sr, Ba)S:Eu$, $(Ba, Sr, Ca)Ga_2S_4:Eu$, $K_2(Si, Ti, Ge)F_6:Mn$, or $Si_{6-z}Al_zO_zN_{8-z}:Eu(0<z<4.2)$.

In particular, it is favorable to use a combination of the two types of fluorescers of $Si_{6-z}Al_zO_zN_{8-z}:Eu$ $(0<z<4.2)$ and $K_2(Si, Ti, Ge)F_6:Mn$ as the fluorescer. The light-emitting device 1 that has good color reproducibility can be realized by combining an element emitting blue light with these two types of fluorescers. It is more favorable to combine a fluorescer of $(Sr, Ca)AlSiN_3:Eu$ in addition to the two types of fluorescers of $Si_{6-z}Al_zO_zN_{8-z}:Eu$ $(0<z<4.2)$ and $K_2(Si, Ti, Ge)F_6:Mn$. For example, the afterglow of the light-emitting device 1 can be reduced by combining the fluorescer of $(Sr, Ca)AlSiN_3:Eu$ as the fluorescer.

For example, it is favorable for the content of the light-scattering particles and/or the fluorescer to be about 9 to 60 weight % of the total weight of the transparent resin portion 70.

Figure 8:
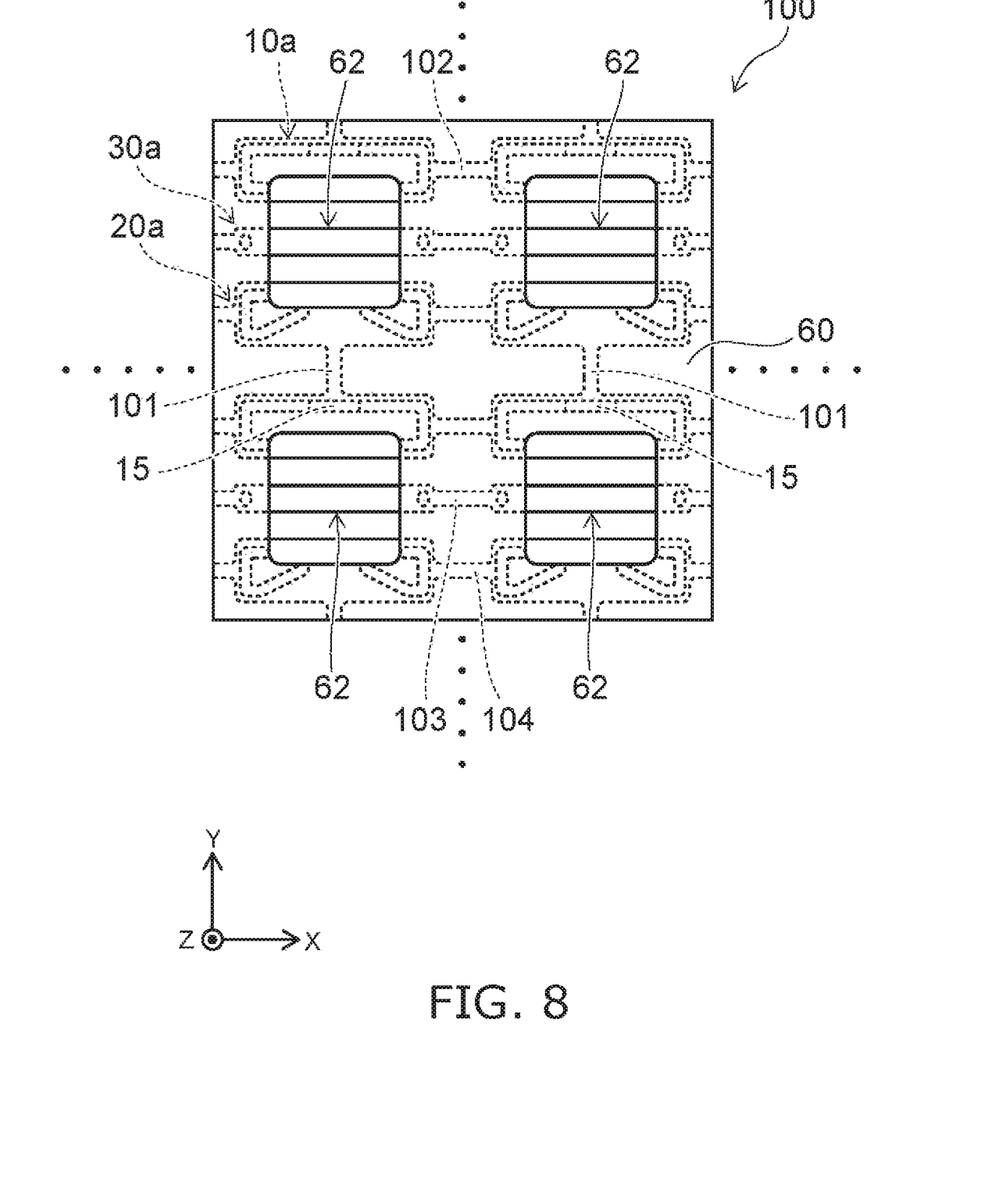
FIG. 8 is a top view of a resin-molded leadframe including the lead of the light-emitting device of the embodiment of the invention.

FIG. 8 is a top view of a resin-molded leadframe 100 of the embodiment.

Figure 9:
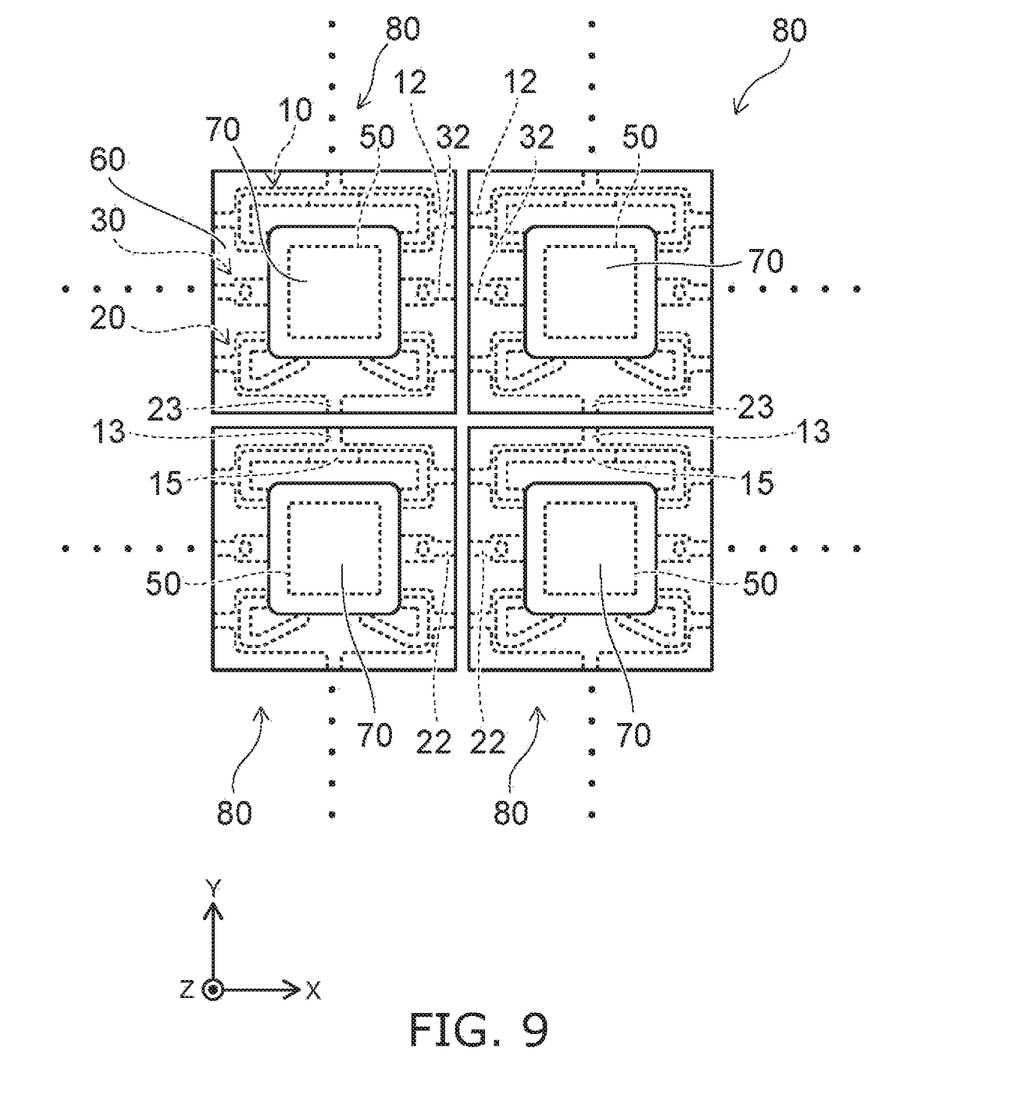
FIG. 9 is a top view showing a cutting process of the resin-molded leadframe shown in FIG. 8.

FIG. 9 is a top view showing the cutting process of the resin-molded leadframe 100 after the light-emitting elements 50, etc., are disposed. In the specification, the term "resin-molded leadframe" may be used before and after the light-emitting element, etc., are disposed.

The resin-molded leadframe 100 includes multiple first lead portions 10a, second lead portions 20a, and third lead portions 30a linked to each other in the X-axis direction and the Y-axis direction. The multiple first lead portions 10a, second lead portions 20a, and third lead portions 30a are linked to a not-illustrated frame. After cutting the resin-molded leadframe 100, the first lead portion 10a becomes the first lead 10; the second lead portion 20a becomes the second lead 20; and the third lead portion 30a becomes the third lead 30.

For example, the first lead portion 10a, the second lead portion 20a, and the third lead portion 30a that are linked to each other are set in a molding die and formed as one body with the resin portion 60. Specifically, the resin portion 60 is cured after being supplied in a fluidic state into the mold recited above. Because the through-hole 15 is continuous with the trench 14, the resin portion 60 flows easily into the through-hole 15 via the trench 14 when molding the resin portion 60. This suppresses distortion when molding the resin portion 60. The concave portion 62 is formed in the resin portion 60.

Because the resin portion 60 enters the through-hole 15 formed in the first lead portion 10a, the adhesion force between the resin portion 60 and the first lead portion 10a is increased.

Also, the adhesion force between the resin portion 60 and each of the lead portions 10a, 20a, and 30a is increased because the resin portion 60 juts into the trench 14 formed in the first lead portion 10a, the trench 24 formed in the second lead portion 20a, and the trench 34 formed in the third lead portion 30a. The adhesion between the first lead portion 10a and the resin portion 60 at the vicinity of the through-hole 15 can be improved because the resin portion 60 that enters the trench 14 and the through-hole 15 of the first lead portion 10a is provided to be continuous. Because the through-hole 15 is continuous with the trench 14, the weak portion at the vicinity of a link portion 101 (the extension portion 13) can exist continuously without being discontinuous; and the absorption effect of the stress can be increased.

As shown in FIG. 3, the adhesion forces between the resin portion 60 and each of the leads 10, 20, and 30 are increased because the resin portion 60 also enters the recesses formed at the lower surfaces 11b, 21b, and 31b of the leads 10, 20, and 30 (the recess at the side surface of each lead that is formed by etching or stamping).

For example, the second lead portion 20a and the first lead portion 10a that are adjacent to each other in the Y-axis direction are linked by the link portion 101. The first lead portions 10a that are adjacent to each other in the X-axis direction are linked by a link portion 102. The second lead portions 20a that are adjacent to each other in the X-axis direction are linked by a link portion 103. The third lead portions 30a that are adjacent to each other in the X-axis direction are linked by a link portion 104.

After the light-emitting elements 50 and the like are disposed, the resin-molded leadframe 100 is separated into the multiple packages 80 by being cut in the X-axis direction and the Y-axis direction as shown in FIG. 9. The link portions 101 to 104 shown in FIG. 8 are cut.

The extension portion 13 of the first lead 10 and an extension portion 23 of the second lead 20 are formed by cutting the link portion 101. The extension portion 12 of the first lead 10 is formed by cutting the link portion 102. An extension portion 32 of the third lead 30 is formed by cutting the link portion 103. An extension portion 22 of the second lead 20 is formed by cutting the link portion 104.

For example, the link portions 101 to 104 are cut using a dicing blade. Or, the link portions 101 to 104 may be cut using a pressing die. When the link portion 101 is cut, stress is generated in the first lead 10 and the second lead 20 at the vicinity of the link portion 101; and the stress may cause cracks in the resin portion 60 at the link portion 101 vicinity.

Conversely, according to the embodiment, the through-hole 15 is provided at the vicinity of the link portion 101 (the extension portion 13); and the resin portion 60 which is softer than a metal enters the through-hole 15. The stress that is generated when cutting the link portion 101 is relaxed by the resin portion 60 inside the through-hole 15. The portion at the vicinity of the link portion 101 (the extension portion 13) where a metal is not provided (the through-hole 15 and the resin portion 60 inside the through-hole 15) functions as an absorption portion of the stress when cutting the link portion 101. The crack occurrence of the resin portion 60 when cutting the link portion 101 can be suppressed thereby.

The interior of the through-hole 15 may be a hollow without providing the resin portion 60. In the case where the interior of the through-hole 15 is a hollow, compared to the case where the resin portion 60 is provided inside the through-hole 15, the stress when cutting the link portion 101 can be relaxed further. In such a case, for example, it is necessary to provide a protrusion in the lower die of the molding die of the resin portion 60 and prevent the resin from entering the through-hole 15 by positioning the protrusion inside the through-hole 15.

In the case where the resin portion 60 is provided inside the through-hole 15, such a separate contrivance is unnecessary; and the manufacturing is simple. Also, by providing the resin portion 60 inside the through-hole 15, the reduced strength of the package 80 can be suppressed while relaxing the cutting stress recited above.

Other than the link portion 101 shown in FIG. 9, through-holes also can be provided at the vicinities of the other link portions 102 to 104. Thereby, the stress when cutting the link portions is relaxed; and the cracks that occur in the resin portion 60 can be suppressed. In such a case as well, if the resin portion 60 is provided inside the through-holes, the manufacturing method can be simple; and the reduced strength of the package 80 can be suppressed. For example, a through-hole may be provided in the portion of the second lead portion 20a at the vicinity of the link portion 101. Also, a through-hole may be provided in the portion of the first lead portion 10a at the vicinity of the link portion 102. A through-hole may be provided in the portion of the third lead portion 30a at the vicinity of the link portion 103. A through-hole may be provided in the portion of the second lead portion 20a at the vicinity of the link portion 104.

When viewed in top-view, the through-hole 15 has a configuration extending along the outer surface of the package 80. In the direction along the outer surface of the package 80 (the X-axis direction), the length of the through-hole 15 is longer than the length of the extension portion 13 (the link portion 101). Thereby, the through-hole 15 exists over a wide area at the extension portion 13 vicinity; and the stress when cutting the link portion 101 can be relaxed reliably.

The embodiments of the present invention have been described with reference to specific examples. However, the present invention is not limited to these specific examples. Based on the above-described embodiments of the present invention, all embodiments that can be implemented with appropriately design modification by one skilled in the art are also within the scope of the present invention as long as the gist of the present invention is included. Besides, within the scope of the spirit of the present invention, one skilled in the art can conceive various modifications, and the modifications fall within the scope of the present invention.

What is claimed is:
1. A light-emitting device, comprising:
a package including a pair of leads, a resin portion holding the pair of leads, and a concave portion having a bottom surface where an upper surface of each of the pair of leads is exposed; and
a light-emitting element mounted at the bottom surface of the concave portion, wherein
the pair of leads each include a main body portion and an extension portion,
the extension portion extends from an outer edge of the main body portion to an outer surface of the package,
the main body portion includes a trench and a through-hole in a portion of the main body portion buried in a sidewall of the concave portion, the through-hole being continuous with the trench, and
when viewed in a top-view, the through-hole is provided inward of the outer edge of the main body portion at a vicinity of the extension portion.
2. The device according to claim 1, wherein a portion of the resin portion is inside the through-hole.
3. The device according to claim 1, wherein the through-hole has a configuration extending along the outer surface.
4. The device according to claim 3, wherein a length of the through-hole in a direction along the outer surface is longer than a length of the extension portion in the direction along the outer surface.

5. The device according to claim 1, wherein the through-hole has a configuration extending in a direction crossing a straight line connecting the extension portion and the light-emitting element.

6. The device according to claim 1, wherein
- a lower surface of the main body portion is exposed at the resin portion, the lower surface being provided on a side opposite to an upper surface of the main body portion, and
- when viewed in a bottom-view, the through-hole is positioned between the extension portion and the lower surface of the main body portion.

\* \* \* \* \*